United States Patent [19]

Anantha et al.

[11] 4,252,582
[45] Feb. 24, 1981

[54] SELF ALIGNED METHOD FOR MAKING BIPOLAR TRANSISTOR HAVING MINIMUM BASE TO EMITTER CONTACT SPACING

[75] Inventors: Narasipur G. Anantha, Hopewell Junction; Harsaran S. Bhatia, Wappinger Falls; James L. Walsh, Hyde Park, all of N.Y.

[73] Assignee: International Business Machines Corporation, Armonk, N.Y.

[21] Appl. No.: 115,307

[22] Filed: Jan. 25, 1980

[51] Int. Cl.³ .................. H01L 21/203; H01L 21/22; H01L 21/31
[52] U.S. Cl. ................................. 148/175; 29/576 E; 29/576 W; 29/578; 29/591; 148/174; 148/187; 148/188; 156/644; 156/653; 156/657; 357/20; 357/50; 357/88; 357/89
[58] Field of Search ............... 148/174, 187, 188, 175; 156/644, 652, 653, 657; 29/576 E, 576 W, 578, 591; 357/20, 50, 88, 89

[56] References Cited

U.S. PATENT DOCUMENTS

| | | | |
|---|---|---|---|
| 3,717,507 | 2/1973 | Abt | 148/1.5 |
| 3,761,328 | 9/1973 | Abt et al. | 148/188 |
| 3,913,211 | 10/1975 | Seeds et al. | 29/578 X |
| 4,115,797 | 9/1978 | Hingarh et al. | 357/89 X |
| 4,157,269 | 6/1979 | Ning et al. | 148/174 X |
| 4,160,991 | 7/1979 | Anantha et al. | 357/50 X |
| 4,168,999 | 9/1979 | Vora et al. | 148/175 |

OTHER PUBLICATIONS

Hsu et al., "Low-Noise Microwave Bipolar Transistor . . . Emitter Width," IEEE Trans. on Electron Dev., vol. ED-25, No. 6, Jun. 1978, pp. 723-730.

Primary Examiner—L. Dewayne Rutledge
Assistant Examiner—W. G. Saba
Attorney, Agent, or Firm—Robert J. Haase

[57] ABSTRACT

A method for making a high performance bipolar transistor characterized by self-aligned emitter and base regions and minimized base and emitter contact spacing. The disclosed method comprises forming a recessed oxide-isolated structure having opposite conductivity epitaxial layer and substrate. Multiple layered mass of alternating silicon nitride and silicon dioxide layers are placed over the base region and over the collector reach-through region. Polycrystalline silicon is deposited between the mesas. The mesas are undercut-etched to expose the extrinsic base region which is ion implanted. Then, the mesas are removed to expose the emitter and intrinsic base regions as well as the collector reach-through regions. The latter exposed regions are ion implanted appropriately. Contacts are made directly to the emitter and collector reach-through regions and indirectly via the polysilicon to the base region.

11 Claims, 9 Drawing Figures

SELF ALIGNED METHOD FOR MAKING BIPOLAR TRANSISTOR HAVING MINIMUM BASE TO EMITTER CONTACT SPACING

BACKGROUND OF THE INVENTION

1. Field of the Invention

The invention generally relates to high performance bipolar transistors and, more particularly, to a method for making such transistors having self-aligned emitter and base regions. The emitter and collector contacts are made directly to the doped single crystal silicon regions while contact to the base is made via a doped polycrystalline silicon layer formed above the surface of the doped single crystal region.

2. Description of the Prior Art

U.S. Pat. No. 4,160,991, issued to the present inventors on July 10, 1979 for "High Performance Bipolar Device and Method For Making Same" and assigned to the present assignee discloses a method using a polycrystalline base contact covered by an oxidized layer which spaces the emitter contact from the base contact. Thus, the base and emitter spacing is as narrow as the thickness of the oxide coating, which can be reduced to less than about 0.5 μm. Narrow base-to-emitter contact spacing reduces the base resistance of the transistor and significantly enhances switching speed performance.

Although the aforesaid contact spacing is reduced, the emitter region is not self aligned relative to the base region of the transistor fabricated in accordance with the cited patent. As a result, the injection from the emitter is not optimally uniform on all sides into the surrounding base region. Moreover, no provision is made in the cited patent for determining the impurity concentration of the intrinsic base region independently of the extrinsic base region.

SUMMARY OF THE INVENTION

A high performance bipolar transistor having self-aligned emitter and base regions for optimally uniform emitter injection and having emitter to base contact spacing which can be reduced to less than 0.5 μm is fabricated in accordance with the present method. Provision also is made for independently doping the extrinsic and intrinsic base regions while allowing for doped polysilicon contact to the base region. Briefly, doped polysilicon is evaporated using a multilayer silicon nitride-silicon dioxide mask which is patterned to cover the collector reach-through region, the emitter region and the extrinsic base region. The polysilicon does not form on the vertical sidewalls of the multilayer mask and is removed from the top surface thereof. Then, the multilayer mask is undercut-etched to expose the extrinsic base region. The extrinsic base region is doped and oxidized using the undercut mask. The mask is removed and the emitter and collector reach-through regions are formed at respective locations from which the mask was removed.

DESCRIPTION OF THE PREFERRED EMBODIMENT

Figure 1:
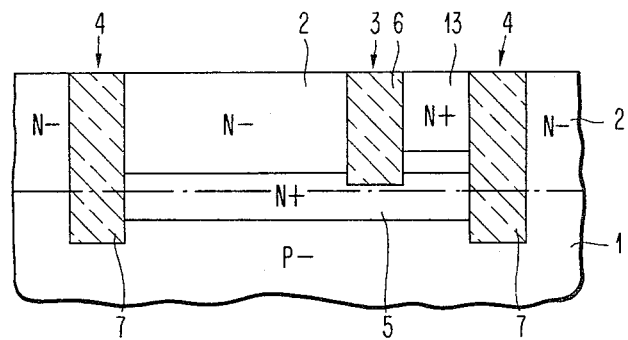
FIGS. 1-9 are simplified sectional views showing a bipolar transistor at successive times during the execution of the method of the present invention.

Referring to FIG. 1, the high performance bipolar transistor of the present invention is fabricated by starting with substrate 1 of p type monocrystalline material into which an N+ layer (not shown in its entirety) is placed by blanket diffusion or ion implantation using conventional techniques. An N epitaxial layer 2 is grown on the surface of substrate 1 to a desired thickness, preferably less than about 2 microns.

The resulting structure is subjected to a series of selective reactive ion etching steps for forming shallow trenches such as in region 3 and deep trenches such as in region 4. It should be noted that the deep trenches extend through the aforementioned N+ layer to subdivide it into a series of N+ subcollectors such a subcollector 5. The shallow trenches penetrate into the subcollectors. After the trenches have been etched, they are filled with pyrolytically deposited silicon dioxide. Trench 3 is filled with pyro oxide 6 prior to the etching of trench 4. Trench 4 is filled by first exposing the etched structure to thermal oxidation to provide an oxide thickness of between 500-2000 Angstroms. The remainder of trench 4 is filled with vapor deposited oxide 7.

The foregoing briefly described processing steps, to fabricate the above described structure, are described in detail in the aforementioned U.S. Pat. No. 4,160,991. Additionally, collector reach-through N+ implant is made in region 13 in a conventional manner. Subsequent processing steps depart from the teachings of the patent.

Figure 2:
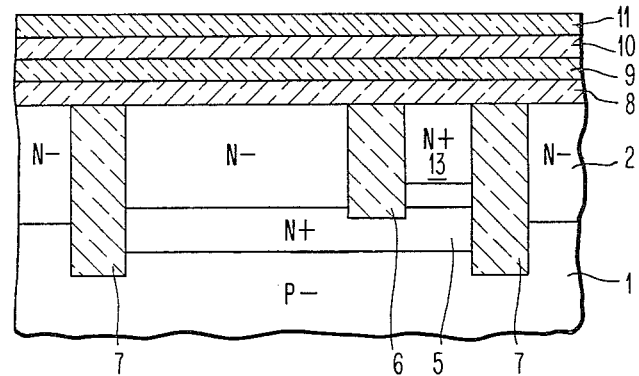
Figure 3:
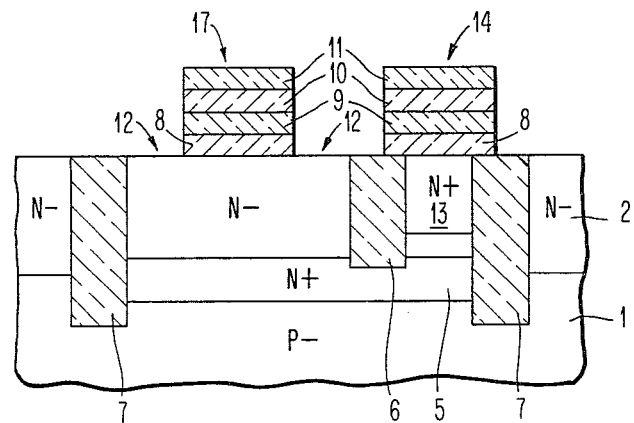

Successive layers of silicon nitride 8, silicon dioxide 9, silicon nitride 10 and silicon dioxide 11 are deposited over the shallow and deep trenched structure as depicted in FIG. 2. The silicon nitride layer 8 preferably is about 1000 Å thick. The remaining layers preferably are of about 500 Å thickness. The oxide preferably is pyrolytically deposited at 900° C. and the nitride preferably is deposited at about 800° C. Using conventional photolithography, the successive layers are etched away to expose the area 12 (later to become the base contact area) of FIG. 3. It should be noted that the collector reach-through area 13 is totally covered by the mesa 14 consisting of the remaining patterned layers 8, 9 and 10 with sufficient overlap so that area 13 remains covered despite an undercut etching step to be described later with reference to mesa 17.

Figure 4:
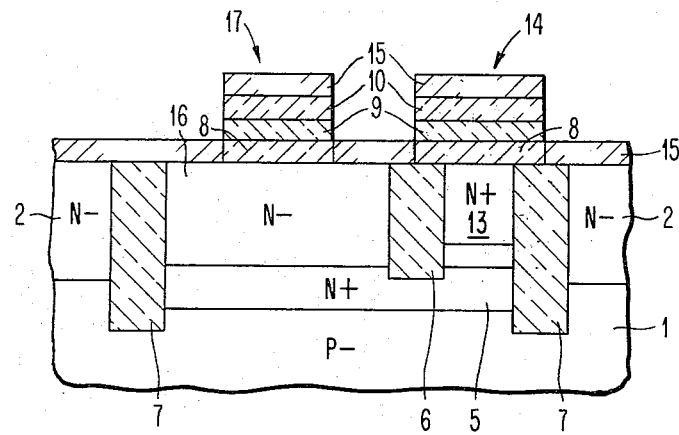

P-doped polycrystalline silicon 15 is evaporated to a thickness of about 2500 Å at a temperature of 650° C. and growth rate of 100 Å/min. as shown in FIG. 4. As a result of the evaporation process, the polycrystalline silicon 15 deposits only on the horizontal surfaces but not on the vertical sidewalls of the mesas consisting of the patterned layers 8, 9 and 10. If the silicon 15 is heavily doped, the underlying base contact area 16 will become sufficiently conductive as a result of outdiffusion from polysilicon 15 during subsequent high temperature processing. Alternatively, a blanket base implant can be done prior to the polycrystalline silicon deposition step.

The multi-layered mesas 14 and 17 are uncovered in the next step by the removal of the polycrystalline silicon 15 from the top surfaces thereof. As previously mentioned, the evaporation process avoids the deposition of the polysilicon 15 on the vertical sidewall surfaces. The mesas 14 and 17 must be uncovered so that they may be further processed and later removed from the final structure. Polycrystalline silicon 15 is removed from the top surfaces of mesas 14 and 17 by a planarization technique.

Figure 5:
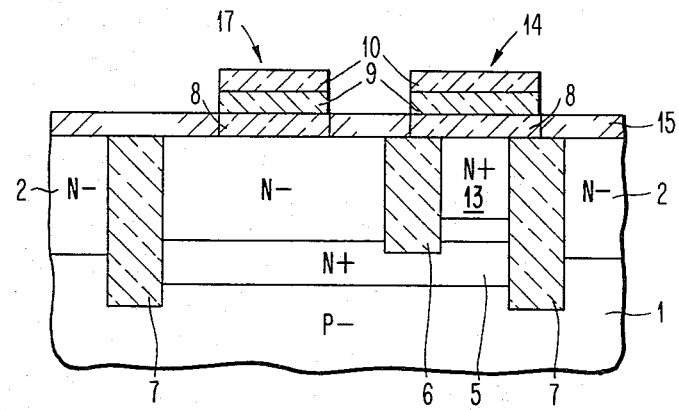

Briefly, the planarization technique comprises spinning a planar layer of photoresist (not shown) over the irregular surface of the deposited polycrystalline layer. The photoresist preferably is polyimide having an etching rate of about 400 Å/min when using CF$_4$ reactive ion etching which is substantially equal to the etching rate of polysilicon 15. Consequently, the surface of the structure remains planar as it is reactively ion etched away through the resist and then into the polysilicon 15 atop mesas 14 and 17. The etching is stopped when nitride layer 10 is reached and the remaining photoresist is removed with a solvent to yield the structure shown in FIG. 5.

Figure 6:
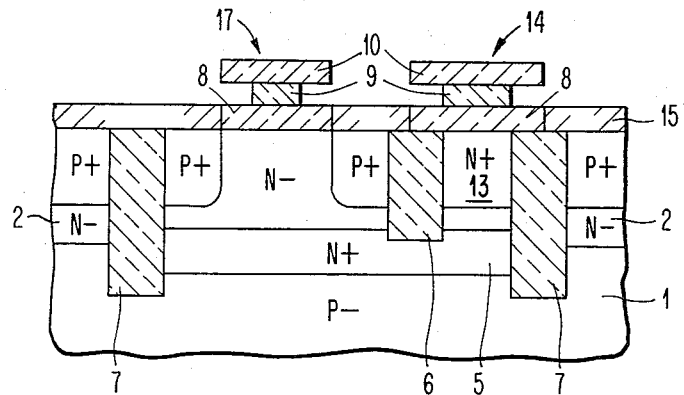
Figure 7:
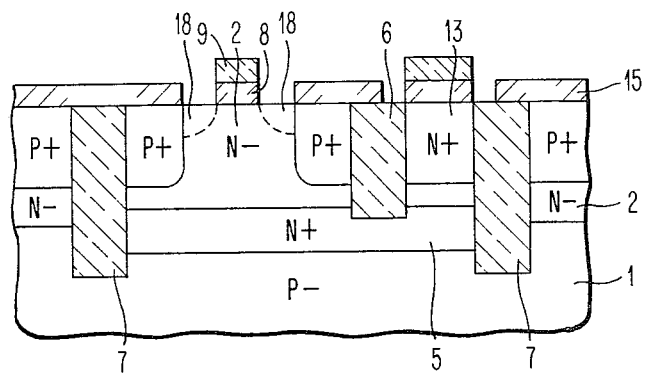
Figure 8:
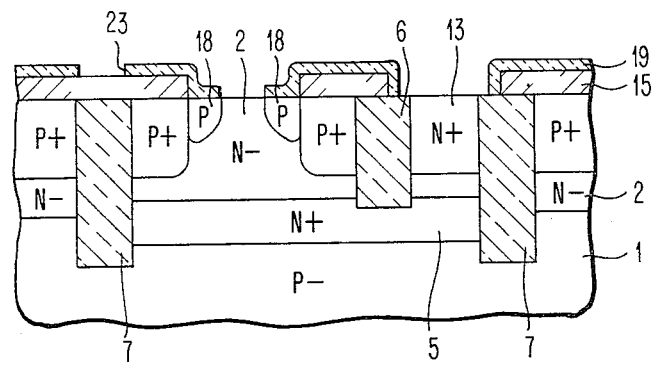

Mesa 17 now is subjected to an undercutting etching treatment, for example, as is described in the paper *Sub-Half-Micrometer Emitter Width* by T. Hsu et al in the IEEE Transactions on Electron Devices, Vol. ED-25, No. 6, June 1978, p. 723. That is, the oxide layer 9 is laterally etched at approximately 1000 Å/min using a buffered HF etch until the remaining layer 9 is equal to the desired emitter width as shown in FIG. 6. Then, nitride layer 10 is removed along with the nitride 8 which is exposed by the undercut oxide 9. A boron implant is made into the exposed epitaxial layer to dope the extrinsic base area 18 of FIG. 7. Preferably, about 2000 Å of oxide 9 and nitride 8 are removed on either side of mesa 17. Thus, the separation between the base and emitter contacts (to be described later) is reduced to a minimum while allowing sufficient oxide thickness to avoid the imperfections such as pin holes associated with very thin oxide. 1000–1500 Å of thermal oxide is now grown.

Figure 9:
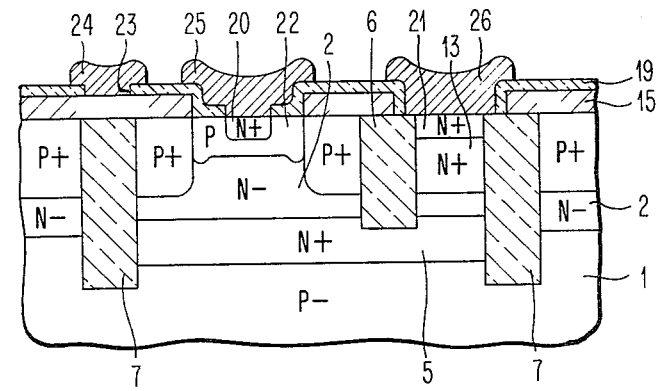

The remaining portions of mesas 17 and 14 now are removed to expose an emitter region centrally located and self aligned with respect to the surrounding extrinsic base region 18 and to expose the collector reach-through region, respectively. N+ emitter implant is made both in emitter region 20 and in collector reach-through surface area 21 as depicted in FIG. 9. Finally, an intrinsic base implant 22 is made below emitter region 20 while the collector reach-through area 21 is masked off in a conventional manner. The structure is completed by opening a base contact hole 23 in oxide 19 and then forming base contact 24, emitter contact 25 and collector contact 26 using standard metallization procedure.

We claim:

1. The method comprising
   forming isolated areas in a semiconductor substrate, each said area to have an extrinsic base region and an emitter region,
   forming multiple layered mesas over said regions of said substrate,
   said mesas comprising at least an upper layer and a lower layer of different masking materials,
   evaporating polycrystalline silicon over said substrate between said mesas and on top of said mesas,
   removing said polycrystalline silicon from on top of said means,
   symmetrically removing the lateral edge of said upper layer over said extrinsic base regions to leave a centrally located portion of said upper layer,
   removing said lower layer where not covered by said upper layer to expose said extrinsic base regions,
   introducing extrinsic base dopant into said substrate where said lower layer was removed,
   forming silicon oxide over said extrinsic base region between said polycrystalline silicon and said mesas,
   removing all remaining portions of said mesas, and
   introducing emitter dopant into said substrate where said mesas were removed.

2. The method described in claim 1 and further including
   forming a collector reach-through region in each said area and
   forming a multiple layered mesa over each said reach-through region when said mesas are formed over said extrinsic base region and said emitter region.

3. The method described in claim 1 wherein recessed oxide isolated areas are formed in said substrate.

4. The method described in claim 1 wherein said isolated areas are formed by steps including depositing an epitaxial layer on said substrate.

5. The method described in claim 4 wherein said epitaxial layer is deposited with conductivity type opposite to the conductivity type of said substrate.

6. The method described in claim 1 wherein said polycrystalline silicon is evaporated to contain dopant of the same type as said extrinsic base dopant.

7. The method described in claim 1 wherein said upper layer is covered by another layer of masking material and said lateral edges of said upper layer are removed by an undercutting etching treatment.

8. The method described in claim 1 and further including introducing intrinsic base dopant into said substrate where said mesas were removed.

9. The method described in claim 8 and further including forming contacts to said polycrystalline silicon and to said emitter region.

10. The method described in claim 1 wherein said upper layer is silicon dioxide and said lower layer is silicon nitride.

11. The method described in claim 1 wherein said multiple layered mesas comprise alternate layers of silicon nitride and silicon dioxide.

* * * * *